(12) United States Patent
Farnworth

(10) Patent No.: US 7,833,881 B2
(45) Date of Patent: Nov. 16, 2010

(54) METHODS FOR FABRICATING SEMICONDUCTOR COMPONENTS AND PACKAGED SEMICONDUCTOR COMPONENTS

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 11/681,648

(22) Filed: Mar. 2, 2007

(65) Prior Publication Data

US 2008/0213976 A1 Sep. 4, 2008

(51) Int. Cl.
*H01L 21/00* (2006.01)
(52) U.S. Cl. .............. 438/460; 438/114; 257/734; 257/780
(58) Field of Classification Search .......... 257/781, 257/200; 438/106, 124, 114, 460
See application file for complete search history.

(56) References Cited

U.S. PATENT DOCUMENTS

| | | | |
|---|---|---|---|
| 6,326,698 B1 * | 12/2001 | Akram | ........... 257/781 |
| 6,338,980 B1 | 1/2002 | Satoh | |
| 6,579,748 B1 | 6/2003 | Okuno et al. | |
| 6,964,915 B2 | 11/2005 | Farnworth et al. | |
| 7,029,949 B2 | 4/2006 | Farnworth et al. | |
| 2004/0051118 A1 | 3/2004 | Bruhns et al. | |
| 2004/0113283 A1 | 6/2004 | Farnworth et al. | |
| 2005/0148160 A1 | 7/2005 | Farnworth et al. | |
| 2005/0181540 A1 | 8/2005 | Farnworth et al. | |
| 2005/0200028 A1 | 9/2005 | Farnworth et al. | |
| 2005/0227415 A1 * | 10/2005 | Farnworth et al. | ........... 438/114 |
| 2005/0250234 A1 * | 11/2005 | Kamikawa et al. | ............ 438/47 |
| 2005/0269700 A1 | 12/2005 | Farnworth et al. | |
| 2006/0183349 A1 | 8/2006 | Farnworth et al. | |
| 2006/0189029 A1 * | 8/2006 | Koduri et al. | ............... 438/106 |
| 2007/0029684 A1 | 2/2007 | Arai et al. | |

FOREIGN PATENT DOCUMENTS

| JP | 11-162885 A | 6/1999 |
|---|---|---|
| JP | 11-177139 A | 7/1999 |

OTHER PUBLICATIONS

International Search Report and Written Opinion for PCT/US2008/055528, Aug. 1, 2008.

* cited by examiner

*Primary Examiner*—Thanh V Pham
*Assistant Examiner*—Mark A Laurenzi, III
(74) *Attorney, Agent, or Firm*—Perkins Coie LLP

(57) ABSTRACT

Packaged semiconductor components and methods for manufacturing packaged semiconductor components. In one embodiment a semiconductor component comprises a die having a semiconductor substrate and an integrated circuit. The substrate has a first side, a second side, a sidewall between the first and second sides, a first indentation at the sidewall around a periphery of the first side, and a second indentation at the sidewall around a periphery of the second side. The component can further include a first exterior cover at the first side and a second exterior cover at the second side. The first exterior cover has a first extension in the first indentation, and the second exterior cover has a second extension in the second indentation. The first and second extensions are spaced apart from each other by an exposed portion of the sidewall.

24 Claims, 6 Drawing Sheets

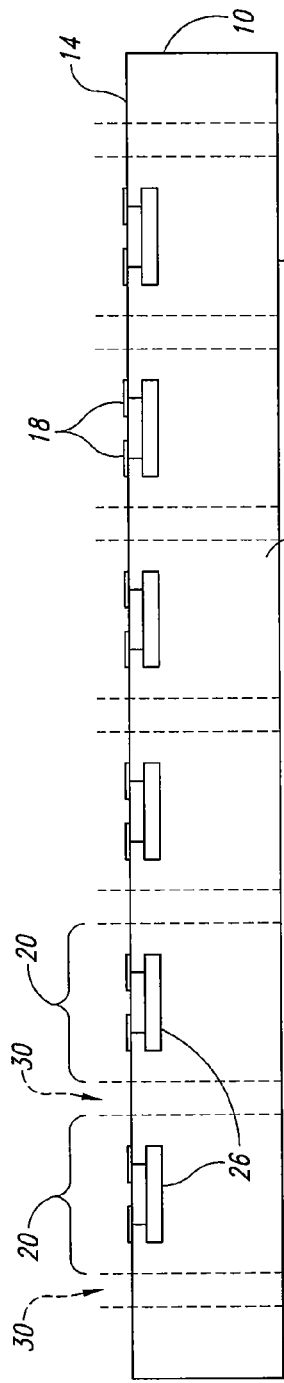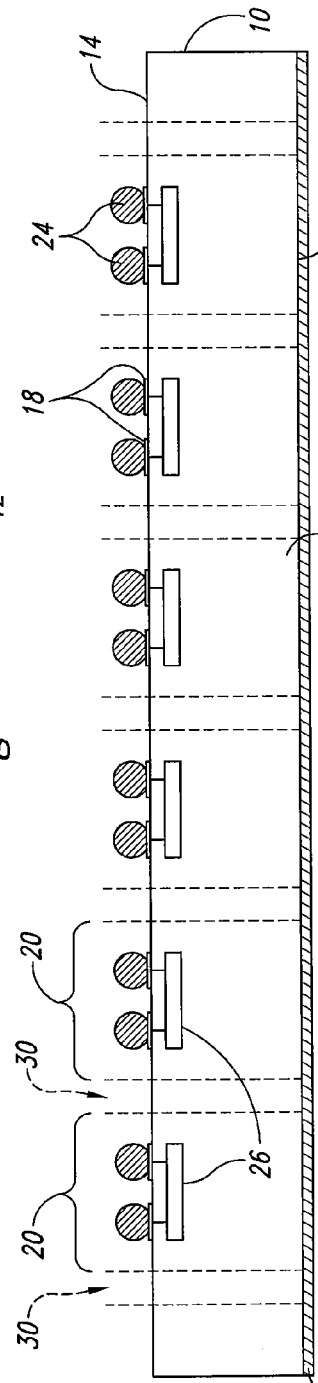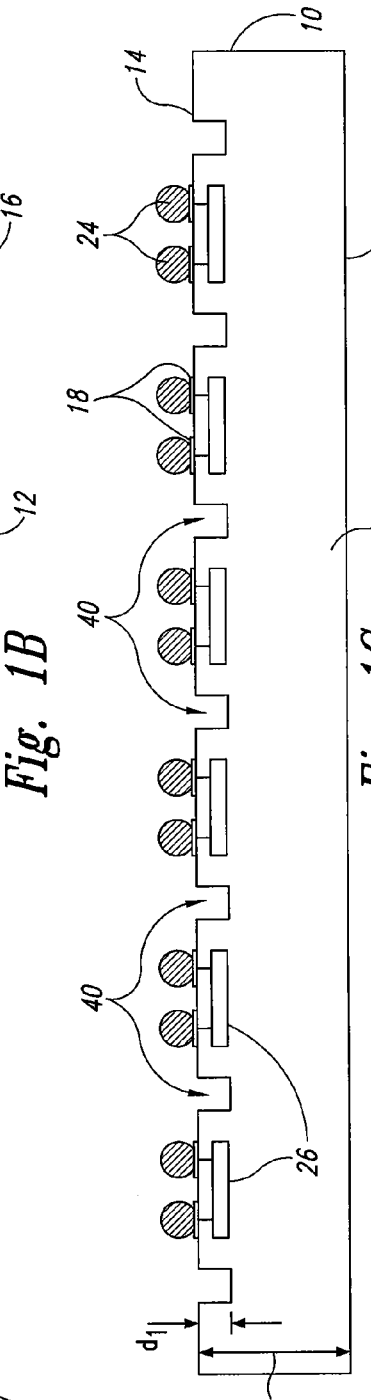

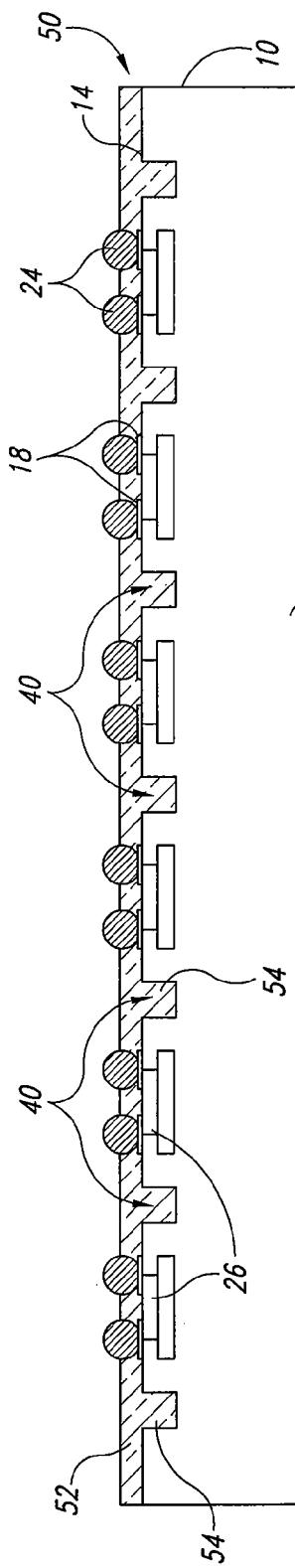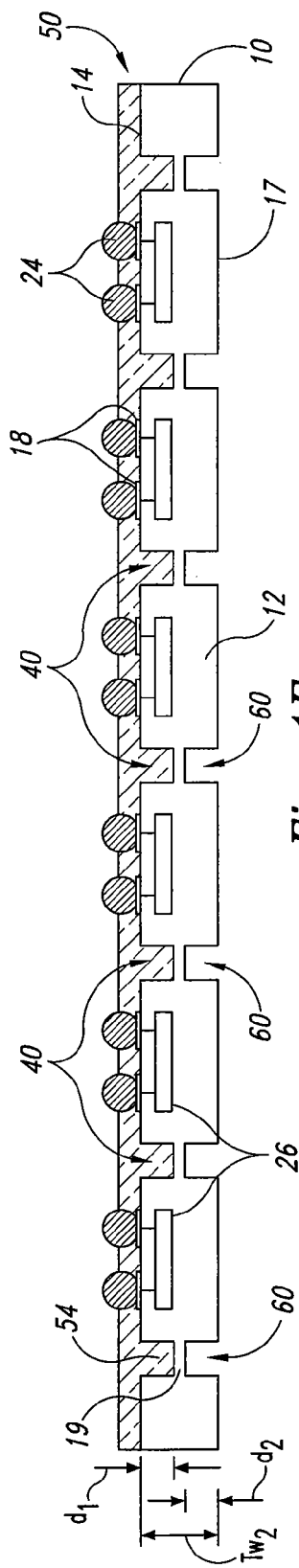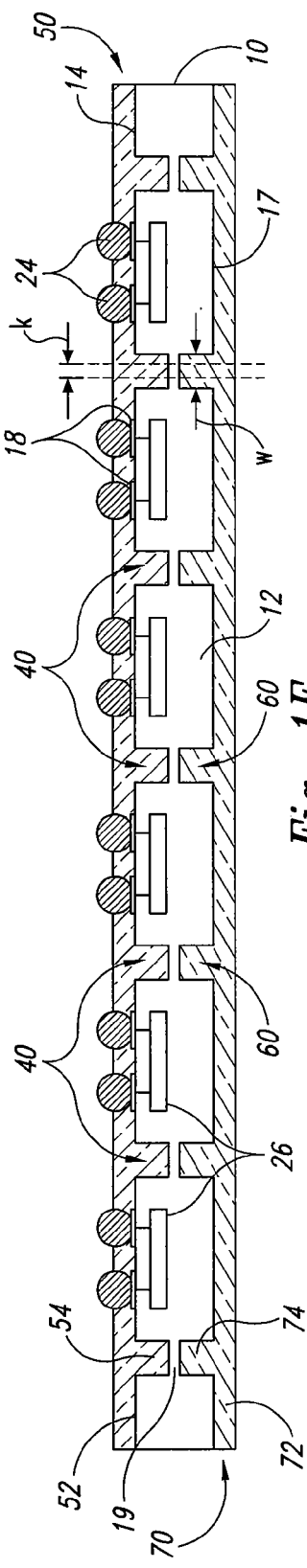

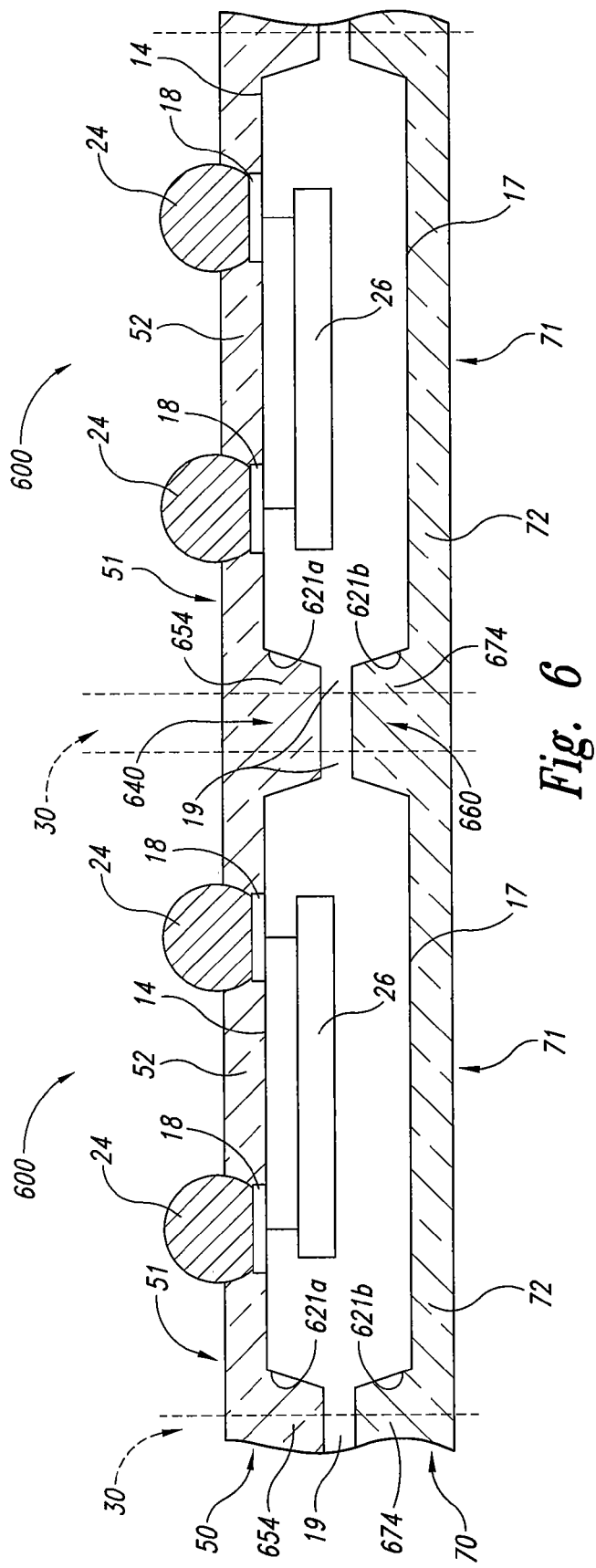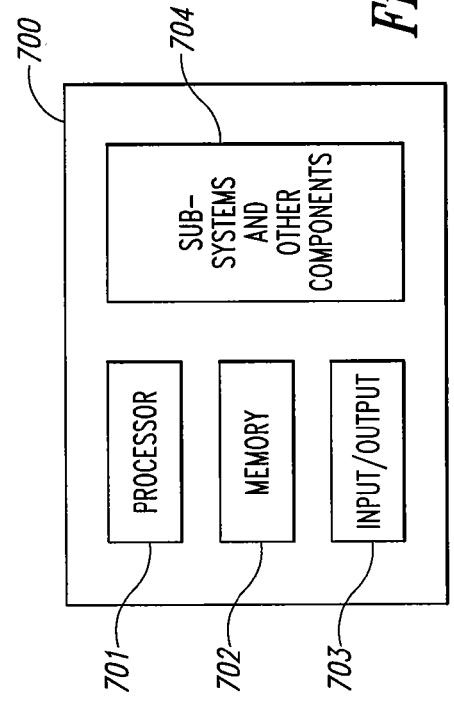

METHODS FOR FABRICATING SEMICONDUCTOR COMPONENTS AND PACKAGED SEMICONDUCTOR COMPONENTS

TECHNICAL FIELD

This invention relates generally to manufacturing semiconductor components. More particularly, several embodiments are directed to packaged semiconductor components, methods for packaging semiconductor components, and systems incorporating packaged semiconductor components.

BACKGROUND

Semiconductor devices are typically manufactured on semiconductor wafers or other types of workpieces using sophisticated equipment and processes that enable reliable, high-quality manufacturing. The individual dies (e.g., devices) generally include integrated circuits and a plurality of bond-pads coupled to the integrated circuits. The bond-pads provide external contacts through which supply voltage, electrical signals, and other input/output parameters are transmitted to/from the integrated circuits. The bond-pads are usually very small, and they are typically arranged in dense arrays having a fine pitch between bond-pads. The wafers and dies can also be quite delicate. As a result, the dies are packaged to protect the dies and to connect the bond-pads to arrays of larger terminals that can be soldered to printed circuit boards.

Chip scale packages (CSPs) are semiconductor components that have outlines, or "footprints," approximately the same size as the dies in the packages. CSPs typically include dense arrays of bond-pads and solder bumps on the bond-pads that permit the packages to be flip-chip mounted to substrates (e.g., module substrates or other circuit boards). Bumped dies are another type of semiconductor component that include dense arrays of solder bumps.

One challenge of manufacturing semiconductor components is cost effectively packaging the dies. The sizes of computers, cell phones, hand-held devices, and other electronic products are continually decreasing, but at the same time the performance of electronic products is increasing. The sizes of the dies accordingly decrease while the number of components in the dies significantly increases to meet the demands of the market. As a result, the number and density of input/output terminals on the dies increase. This can significantly increase the cost of manufacturing semiconductor components.

Several existing processes package high-performance semiconductor dies in six-sided CSPs that completely encapsulate the dies while the dies are arranged in the format of a wafer (i.e., wafer-level packaging). One existing wafer-level packaging process for CSPs includes cutting deep trenches on only the active side of the wafer between the dies and depositing a polymeric material on the active side to fill the trenches and cover the dies. The wafer is then thinned from the backside until the trenches are exposed such that each die is completely separated from adjacent dies by the polymeric material in the trenches. Another layer of the polymeric material is applied to the backside of the dies, and the assembly is then cut along the polymeric material in the trenches to separate the packaged dies from each other. This process accordingly forms six-sided packages that completely encapsulate the dies.

One challenge of fabricating such six-sided packages is that it is difficult to cut deep channels into the wafer (e.g., channels deeper than approximately 250 microns). As a result, the wafer must be thinned to a thickness less than the depth of trenches to expose the polymeric material in the channels before the backside of the dies is coated with the additional layer of the polymeric material. In many cases the wafer is thinned to less than 250 microns to isolate the dies between the polymeric material in the trenches. This can be problematic because such thin dies are subject to warping or bending. More specifically, because the polymeric material and the dies have significantly different thermal expansion coefficients, thermal cycling can cause extensive warping and even breakage of the very thin dies. Therefore, it would be desirable to package semiconductor dies using wafer-level packaging techniques that provide more robust packages.

BRIEF DESCRIPTION OF THE DRAWINGS

FIGS. 1A-F are schematic cross-sectional views illustrating stages of a method for manufacturing semiconductor components in accordance with an embodiment of the invention.

FIG. 6 is a schematic cross-sectional view of a portion of a semiconductor wafer at a stage of a method for fabricating semiconductor components in accordance with an embodiment of the invention.

FIG. 7 is a schematic view of a system that incorporates semiconductor components in accordance with embodiments of the invention.

DETAILED DESCRIPTION

Figure 2:
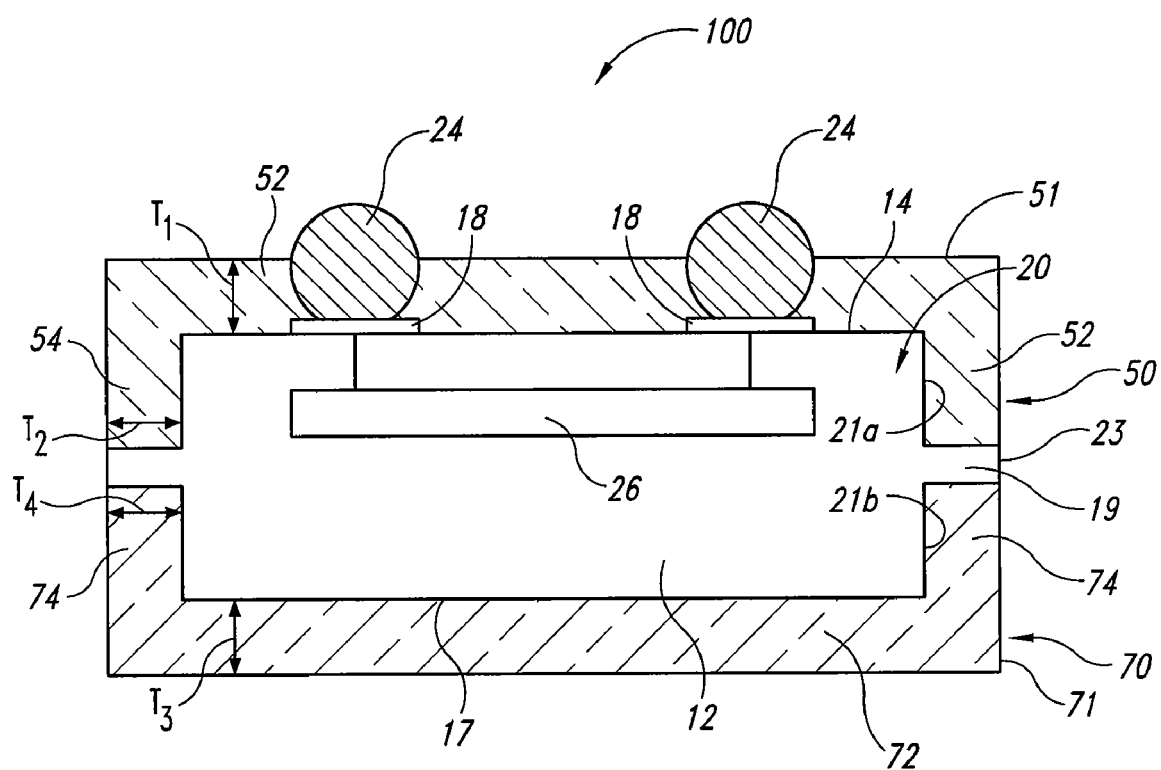
FIG. 2 is a schematic cross-sectional view of a semiconductor component in accordance with an embodiment of the invention.

Specific details of several embodiments of the disclosure are described below with reference to packaged semiconductor components and methods for manufacturing packaged semiconductor components. The semiconductor components are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash-memory), processors, imagers, and other types of devices can be constructed on semiconductor wafers. Although many of the embodiments are described below with respect to semiconductor devices that have integrated circuits, other types of devices manufactured on other types of substrates may be within the scope of the invention. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the features shown and described below with reference to FIGS. 1A-7.

FIG. 1A illustrates a semiconductor wafer 10 at one stage of an embodiment of a method for fabricating semiconductor components. The wafer 10 includes a substrate 12 having a first side 14, a back surface 16, and a plurality of die contacts 18 or other types of electrical input/output terminals at the first side 14. The first side 14 is accordingly an active side or circuit side of the wafer 10. The wafer 10 further includes a plurality of dies 20, and individual dies include an integrated circuit 26 electrically coupled to corresponding die contacts 18 at the first side 14. The dies 20 can comprise any type of semiconductor device having a desired configuration. For example, each die 20 can comprise a dynamic random access memory (DRAM), a static random access memory (SRAM), a flash memory, a micro-processor, a digital signal processor, an application specific integrated circuit, an imager, or other type of semiconductor device. The wafer 10 further includes a plurality of lanes 30 between the dies 20. The dies 20 are typically arranged in a grid or other type of pattern on the wafer 10 according to the specific application.

FIG. 1A provides one example of a semiconductor wafer in which the die contacts 18 are located at the first side 14 of the wafer 10. In other embodiments, however, the die contacts 18 can be located on the back surface 16 or at a second surface of the substrate formed later by thinning the wafer 10. In these embodiments, the die contacts 18 are connected to the integrated circuits 26 using interconnects that pass to the backside of the wafer. As such, although the following processes are described as being performed on the first side 14 and then the back surface 16, it is to be understood that any of the operations can be reversed. Moreover, even though the illustrated die contacts 18 are arranged in two rows along the center of each die 20, the die contacts 18 can be in arrays that have different configurations. The die contacts 18 are generally circular-shaped metal pads having a desired size and spacing. For example, the die contacts 18 can comprise nickel, copper, gold, silver, platinum, palladium, tin, zinc, alloys of these metals, and/or other metals suitable for soldering.

FIG. 1B illustrates the wafer 10 at a stage in which contact bumps 24 or other connectors are formed on the die contacts 18. The contact bumps 24 can comprise metal bumps deposited on the die contacts 18 using a suitable deposition process, such as stenciling/reflow, ball deposits, and other processes. The contact bumps 24 can comprise solder, gold balls, other metals, or a conductive polymer. The contact bumps 24 are used to interconnect the die contacts 18 to corresponding terminals on a printed circuit board, lead frame, module, or other suitable device. As shown in FIG. 1B, a dicing tape 32 can be attached to the back surface 16 of the wafer 10.

FIG. 1C illustrates the wafer 10 at a subsequent stage of the method in which a plurality of first trenches 40 are formed along the lanes 30 at the first side 14 of the wafer 10. In this embodiment, the first trenches 40 are arranged in a grid between the dies 20. The first trenches 40 can be formed by scribing the wafer along the lanes 30 using a dicing saw having blades set such that the kerfs extend to only an intermediate depth $d_1$ within the wafer 10. The first trenches 40 can alternatively be formed using an etching process that etches the first trenches 40 through an etch mask (not shown) formed on the first side 14 of the wafer 10. The etching process can be a wet etching process, a dry etching process, or a plasma etching process. In the case of etching, the depth $d_1$ of the first trenches 40 can be controlled using suitable endpointing techniques. Another alternative for forming the first trenches 40 is laser machining the wafer 10. Suitable laser systems for forming the first trenches 40 are manufactured by Electro Scientific, Inc., of Portland, Oreg. (e.g., Model Number 2700).

As shown in FIG. 1C, the first trenches 40 do not extend through the full thickness $Tw_1$ of the wafer 10 defined by the distance between the first side 14 and the back surface 16. Rather, the first trenches 40 have an intermediate depth $d_1$ measured from the surface of the first side 14 of the wafer 10 that is less than the thickness $Tw_1$. In one example, the initial thickness $Tw_1$ of the wafer 10 is approximately 700-1,000 microns (e.g., approximately 750 microns), and the first trenches 40 have a depth $d_1$ of less than approximately 250 microns. The depth $d_1$ of the first trenches 40, for example, can be approximately 50-200 microns. As explained more fully below, the depth $d_1$ is also less than a final wafer thickness of the wafer 10 after it has been thinned.

FIG. 1D illustrates a subsequent stage in the method in which the first trenches 40 are filled with a first protective material 50. The first protective material 50 can form a first cover member having a front side portion 52 covering the first side 14 and first extensions 54 in the first trenches 40. The first cover member can be formed by depositing a polymeric material onto the first side 14 of the wafer 10 using suitable molding techniques, screen printing, stenciling, or spin-on processes. The first protective material 50 can comprise a curable polymer, such as a silicone, a polyimide, or an epoxy. In addition, the first protective material 50 can include fillers, such as silicates, or other materials that reduce the coefficient of thermal expansion and control the viscosity of the first protective material 50. One suitable curable polymer material is manufactured by Dexter Electronic Materials of Rocky Hill, Conn. under the trademark "HYSOL" FP 4450. The first protective material 50 can be cured at this stage to harden the material. For example, curing can be formed by placing the wafer 10 in a chamber having a temperature of about 90 degrees to 165 degrees C. for about 30-60 minutes. In other embodiments, however, the first protective material 50 can be cured at a later stage of the method.

FIG. 1E illustrates the wafer 10 at a subsequent stage of the method in which the wafer 10 has been thinned to form a second side 17 opposite the first side 14. The wafer 10 can be thinned by grinding the wafer 10 from the back surface 16 (FIG. 1D) at the first thickness $Tw_1$ to the second side 17 at a second thickness $Tw_2$. The second thickness $Tw_2$, for example, can be approximately 300-500 microns (e.g., approximately 450 microns). In other embodiments, the second thickness can be more or less than 300-500 microns.

After thinning the wafer 10, a plurality of second trenches 60 are formed in the second side 17 along the lanes 30. The second trenches 60 are at least generally aligned with the first trenches 40 at the first side 14 of the wafer 10, and the second trenches 60 have a second intermediate depth $d_2$ from the second side 17 that does not extend to the intermediate depth $d_1$ of the first trenches 40. In specific embodiments, the widths and depths of the first and second trenches 40 and 60 are the same. The second trenches 60 are separated from the first trenches 40 by shoulders 19 in the lanes 30. The shoulders 19 are portions of the wafer 10. As a result, the sum of the first intermediate depth $d_1$ and second intermediate depth $d_2$ is less than the second thickness $Tw_2$ of the wafer 10. The second trenches 60 can be formed by sawing, etching, or laser cutting, as described above with respect to the first trenches 40 in FIG. 1C.

FIG. 1F illustrates the wafer 10 at another stage of the method in which a second protective material 70 is deposited onto the second side 17 of the wafer 10. The second protective material 70 fills at least a portion of the second trenches 60. The second protective material 70 can be the same as the first protective material 50, or the second protective material 70 can be different than the first protective material 50. For example, the second protective material 70 can be a polymeric material, such as a silicone, a polyimide, or an epoxy, either with or without suitable fillers. The second protective material 70 can be molded to form a second cover member having a backside portion 72 that covers the second side 17 and second extensions 74 in the second trenches 60. The second protective material 70 can be cured to harden the second cover member. In practice, the first protective material 50 and the second protective material 70 can be cured at the same time after depositing the second protective material 70 onto the second side 17 of the wafer 10.

After forming the second cover member from the second protective material 70, the wafer 10 can be cut along the lanes 30 between the dies 20 to separate the dies 20 from each other. The wafer 10 is cut such that the kerf k of the cut is less than the width w of the first and second trenches 40 and 60. The first and second trenches 40 and 60 should be aligned and the kerfs k should be centered in the trenches so that the thickness of the protective materials around the sidewall of the dies 20 is consistent.

FIG. 2 is a schematic cross-sectional view illustrating a semiconductor component 100 formed from a portion of the wafer 10 (FIG. 1) after cutting the wafer 10 along the lanes 30. Like reference numbers refer to like components in FIGS. 1A-2. The semiconductor component 100 includes a die 20, a first exterior cover 51 of the first protective material 50 formed from the first cover member, and a second exterior cover 71 of the second protective material 70 formed from the second cover member. The die 20 has a sidewall with a first indentation 21a around the periphery of the die 20 at the first side 14, a second indentation 21b around the periphery of the die 20 at the second side 17, and the shoulder 19 projecting outwardly around the periphery of the die 20. The first exterior cover 51 accordingly has the front side portion 52 over the first side 14 and the first extension 54 projecting from the front side portion 52 in the first indentation 21a. The second exterior cover 71 has a backside portion 72 over the second side 17 and the second extension 74 projecting from the backside portion 72 in the second indentation 21b. The first protective cover 51 and the second protective cover 71 encase virtually all of the die 20 except for an exposed portion 23 of the shoulder 19 between the first extension 54 and the second extension 74. As a result, the semiconductor component 100 has pseudo six-sided protection except for the exposed portion 23 of the shoulder 19.

In a particular embodiment, the front side portion 52 of the first exterior cover 51 has a thickness $T_1$ and the first extension 54 has a thickness of $T_2$ at least substantially equal to the thickness $T_1$. Accordingly, the forces exerted by the first exterior cover 51 on the die 20 during thermal cycling are equal for both the front side portion 52 and the first extension 54. Similarly, the backside portion 72 of the second exterior cover 71 has a thickness $T_3$ and the second extension 74 has a thickness $T_4$ substantially equal to the thickness $T_3$. Moreover, in a specific embodiment, the thicknesses $T_1$, $T_2$, $T_3$, and $T_4$ can all be substantially equal to each other such that the forces exerted on the die 20 by the first exterior cover 51 are substantially equal to the forces exerted on the die 20 by the second exterior cover 71. Such equal loading on the front side and backside of the die 20 can reduce flexing and warpage of the die 20.

Several embodiments of the semiconductor component 100 can provide the virtual equivalent of complete six-sided protection for the die 20 with a thicker substrate than existing six-sided packages formed using trenches cut in only one side of the wafer. More specifically, it is difficult to cut trenches deeper than approximately 250 microns in the wafer, and thus the dies in many existing six-sided packages are thinned to less than approximately 250 microns before applying the polymeric material to the backside of the dies. Such thin dies are subject to warping or breaking during subsequent handling and/or thermal cycling. Several embodiments of the semiconductor component 100, however, can have a thickness substantially greater than 250 microns (e.g., 300-700 microns) because the first and second trenches are aligned with each other and spaced apart by a portion of the wafer (e.g., the shoulders). As a result, the semiconductor component 100 provides a robust device with the virtual equivalent of complete six-sided encapsulation.

Several embodiments of the semiconductor component 100, moreover, can be packaged at the wafer level without having to handle individual dies before they are fully protected. This may reduce the damage caused by handling unprotected dies before they are encapsulated that may occur in many existing packaging processes. More specifically, by performing a partial scribe from each side of the wafer, the motion of the wafer is constrained while still allowing formation of full front side and backside encapsulation for protection of the exposed corners of the die 20. The full corner protection shown in the illustrated embodiment of the semiconductor component 100 can survive the environmental testing and operation conditions while preventing edge separation.

Specific embodiments of the semiconductor component 100 can further provide uniform loading on the wafer. For example, by forming the first exterior cover and the second exterior cover to have approximately equal thicknesses, the stresses induced by thermal contraction/expansion of the first and second exterior covers can be approximately equal. In these embodiments, the loading on the front side counteracts the loading on the backside to mitigate or eliminate warpage and cracking.

Figure 3:
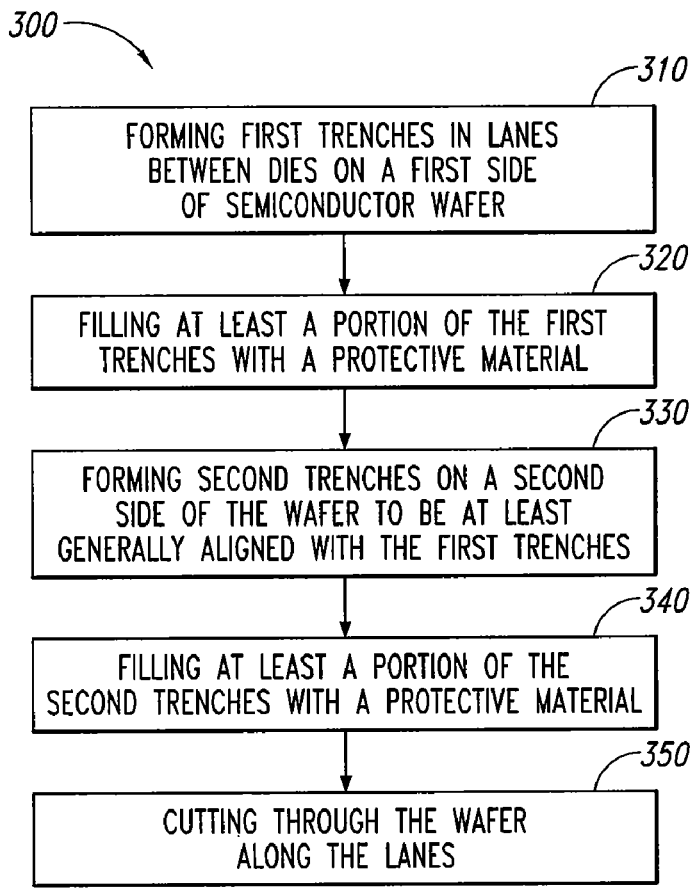
FIG. 3 is a flow chart of a method for fabricating semiconductor components in accordance with an embodiment of the invention.

FIG. 3 is a flow chart of an embodiment of a method 300 for manufacturing semiconductor components. The method 300 includes forming a plurality of first trenches in lanes between dies on a first side of a semiconductor wafer (block 310), and filling at least a portion of the first trenches with a protective material (block 320). The method 300 continues by forming a plurality of second trenches on a second side of the wafer that are at least generally aligned with the first trenches along the cutting lanes (block 330). As explained above, many applications should have good alignment between the first and second trenches, but a certain degree of misalignment can be acceptable. The method 300 further includes filling at least a portion of the second trenches with the protective material (block 340), and cutting through the wafer along the lanes (block 350). The semiconductor components are thus formed after cutting through the wafer along the cutting lanes.

Figure 4:
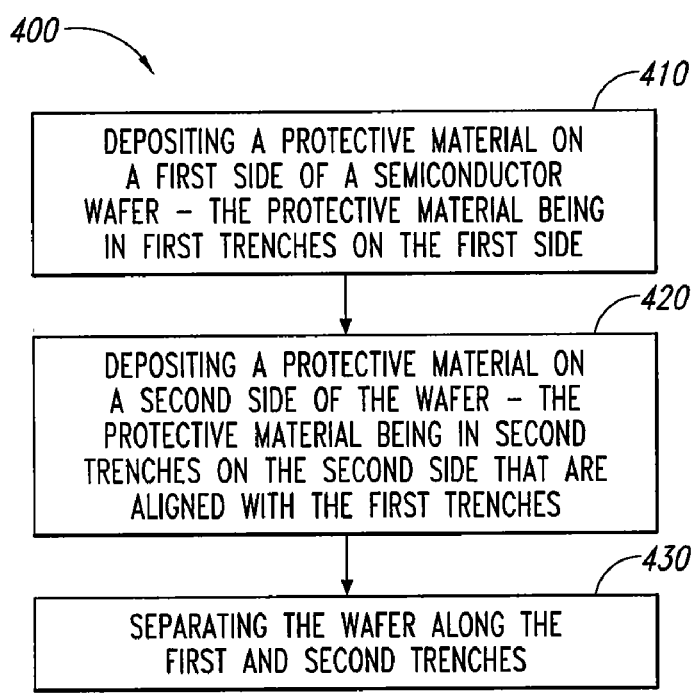
FIG. 4 is a flow chart of a method for fabricating semiconductor components in accordance with another embodiment of the invention.

FIG. 4 illustrates an embodiment of another method 400 for manufacturing semiconductor components. The method 400 includes depositing a protective material on a first side of a semiconductor wafer having a plurality of dies so that the protective material is in first trenches between the dies on the first side of the wafer (block 410). The method 400 also includes depositing a protective material on a second side of the wafer so that the protective material is in second trenches on the second side of the wafer (block 420). The second trenches are at least generally aligned with the first trenches. The protective material in the first trenches can be the same as the protective material in the second trenches. In alternative embodiments, however, the protective material in the second trenches is different than that in the first trenches. The method 400 further includes separating the wafer along the first and second trenches (block 430).

Figure 5:
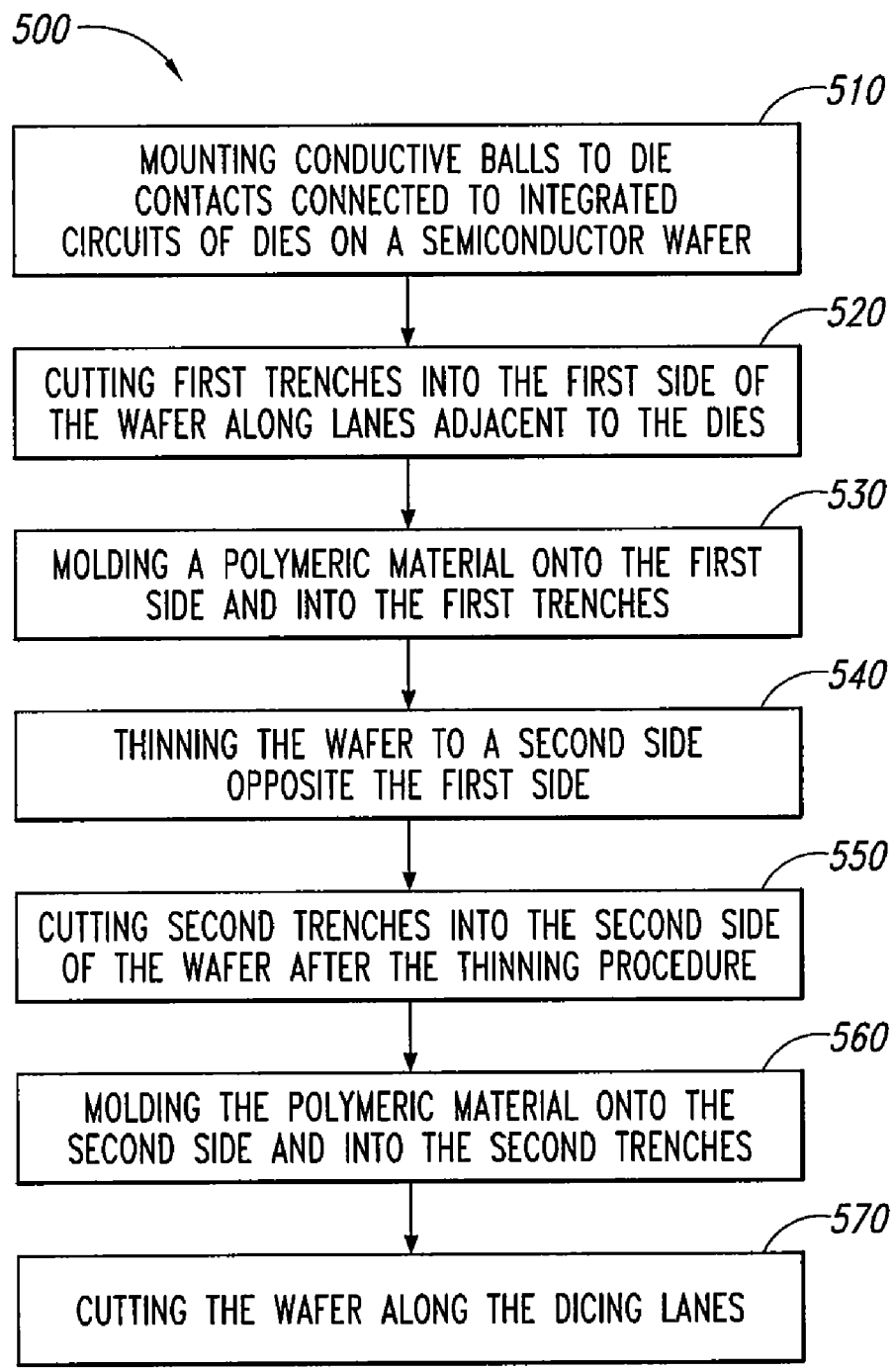
FIG. 5 is a flow chart of a method for fabricating semiconductor components in accordance with another embodiment of the invention.

FIG. 5 is a flow chart illustrating an embodiment of still another method 500 for manufacturing semiconductor components. The method 500 includes mounting conductive balls or bumps to die contacts connected to integrated circuits of dies on a semiconductor wafer (block 510). The die contacts are at a first side of the wafer. The method 500 continues by cutting first trenches into the first side of the wafer along lanes adjacent to the dies such that the first trenches have a first depth in the wafer (block 520). The method 500 further includes molding a polymeric material onto the first side and into the first trenches (block 530) and thinning the wafer to a second side opposite the first side (block 540). The method 500 also includes cutting second trenches into the second side of the wafer after the thinning procedure so that the second trenches are at least generally aligned with the first trenches along the lanes (block 550) and molding the polymeric material onto the second side and into the second trenches (block 560). The method 500 further includes cutting the wafer along the dicing lanes (block 570). The process of cutting the wafer forms individual packaged components that have a first exterior cover at the first side with a first extension extending toward the second side, a second exterior cover at the second side with a second extension extending toward the first side, and a sidewall between the first and second sides. The sidewall includes an exterior portion of the first extension, an exterior portion of the second extension, and an exposed portion of the semiconductor wafer between the first and second extensions.

FIG. 6 is a cross-sectional view illustrating semiconductor components 600 in accordance with another embodiment. Like reference numbers refer to like components in FIGS. 1A-2 and 6. The semiconductor components 600 are similar to the semiconductor component 100 illustrated in FIG. 2, but the semiconductor components 600 have first and second channels or trenches 640 and 660, respectively, that have slanted or inclined sidewalls along first and second indentations 621a and 621b, respectively. The inclined portions of the first and second indentations 621a and 621b can be formed using a beveled saw to cut the first and second channels 640 and 660, respectively. After the wafer has been cut along the lanes 30, each semiconductor component 600 has a first exterior cover 51 with a first beveled extension 654 and a second exterior cover 71 with a second beveled extension 674.

Any one of the semiconductor components described above with reference to FIGS. 1A-6 can be incorporated into any of a myriad of larger and/or more complex systems, a representative example of which is system 700 shown schematically in FIG. 7. The system 700 can include a processor 701, a memory 702 (e.g., SRAM, DRAM, flash, and/or other memory device), input/output devices 703, and/or other subsystems or components 704. The foregoing semiconductor components described above with reference to FIGS. 1A-6 may be included in any of the components shown in FIG. 7. The resulting system 700 can perform any of a wide variety of computing, processing, storage, sensing, imaging, and/or other functions. Accordingly, representative systems 700 include, without limitation, computers and/or other data processors, for example, desktop computers, laptop computers, Internet appliances, hand-held devices (e.g., palm-top computers, wearable computers, cellular or mobile phones, personal digital assistants, etc.), multi-processor systems, processor-based or programmable consumer electronics, network computers, and minicomputers. Other representative systems 700 include cameras, light or other radiation sensors, servers and associated server subsystems, display devices, and/or other memory devices. In such systems, individual dies can include imager arrays, such as CMOS imagers. Components of the system 700 may be housed in a single unit or distributed over multiple, interconnected units (e.g., through a communications network). The components of the system 700 can accordingly include local and/or remote memory storage devices, and any of a wide variety of computer readable media.

From the foregoing, it will be appreciated that specific embodiments of the invention have been described herein for purposes of illustration, but that various modifications may be made without deviating from the inventions. For example, many of the elements of one embodiment can be combined with other embodiments in addition to, or in lieu of, the elements of the other embodiments. For example, the solder balls can be deposited onto the first side of the wafer after forming the first trenches. In still additional embodiments, the second trenches can be formed from the back surface 16 (FIG. 1D) before thinning the wafer to form the second side 17 (FIG. 1E). Additionally, where the context permits, singular or plural terms may also include plural or singular terms, respectively. Moreover, unless the word "or" is expressly limited to mean only a single item exclusive from the other items in reference to a list of two or more items, then the use of "or" in such a list means including (a) any single item in the list, (b) all of the items in the list, or (c) any combination of the items in the list. Additionally, the term "comprising" is used throughout the following disclosure to mean including at least the recited feature(s) such that any greater number of the same feature and/or additional types of features or components are not precluded. Accordingly, the invention is not limited except as by the appended claims.

I claim:

1. A method of manufacturing semiconductor components, comprising:
    forming a plurality of first trenches in lanes between dies on a first side of a semiconductor wafer;
    filling at least a portion of the first trenches with a protective material;
    forming a plurality of second trenches on a second side of the wafer before cutting through the wafer, wherein the first trenches are at least generally aligned with the second trenches along the lanes;
    filling at least a portion of the second trenches with the protective material before cutting through the wafer; and
    cutting through the wafer along the lanes after forming the plurality of second trenches and after filling at least a portion of the second trenches.

2. The method of claim 1 wherein:
    forming the first trenches comprises cutting the first trenches to a first intermediate depth in the wafer; and
    forming the second trenches comprises cutting the second trenches to a second intermediate depth in the wafer, and wherein the sum of the first and second intermediate depths is less than a thickness of the wafer between the first and second sides.

3. The method of claim 1 wherein:
    forming the first trenches comprises cutting the first trenches to a first intermediate depth in the wafer; and
    forming the second trenches comprises cutting the second trenches to a second intermediate depth in the wafer, and wherein a portion of the semiconductor wafer is between the first trenches and the second trenches.

4. The method of claim 1 wherein:
    forming the first trenches comprises cutting the first trenches into the first side;

filling at least a portion of the first trenches with the protective material comprises depositing a polymeric material onto the first side of the wafer;
the method further comprises thinning the wafer before forming the second trenches, wherein the thinning process forms the second side;
forming the second trenches comprises cutting the second trenches into the second side after thinning the wafer; and
filling at least a portion of the second trenches with the protective material comprises depositing a polymeric material onto the second side of the wafer.

5. The method of claim 4 wherein the wafer is initially approximately 700-1000 microns thick, and wherein the thinning procedure reduces a thickness between the first and second sides to approximately 300-500 microns.

6. The method of claim 4 wherein depositing the polymeric material onto the first side comprises molding the polymeric material over the first side and into the first trenches before thinning the wafer, and wherein depositing the polymeric material onto the second side comprises molding the polymeric material over the second side and into the second trenches.

7. The method of claim 1 wherein cutting the wafer along the lanes forms a sidewall around each die between the first and second sides, and wherein the sidewall includes a first portion defined at least in part by the protective material in the first trenches, a second portion defined at least in part by the protective material in the second trenches, and a medial portion between the first and second portions defined at least in part by the semiconductor wafer.

8. The method of claim 1 wherein:
filling at least a portion of the first trenches with the protective material comprises molding a polymeric material over the first side and into the first trenches;
filling at least a portion of the second trenches with the protective material comprises molding a polymeric layer over the second side and into the second trenches; and
cutting the wafer along the lanes separates the dies into individual semiconductor components that have a first exterior cover with a first extension extending toward the second side, a second exterior cover with a second extension extending toward the first side, and a sidewall around each die between the first and second sides, wherein the sidewall includes an exterior portion of the first extension, an exterior portion of the second extension, and an exposed portion of the semiconductor wafer between the first and second extensions.

9. The method of claim 8 wherein the first exterior cover has a front side portion over the first side and the first extension projects from the front side portion, the second exterior cover has a backside portion over the second side and the second extension projects from the backside portion, and the front side portion, the first extension, the backside portion, and the second extension have at least approximately the same thickness.

10. A method for manufacturing semiconductor components, comprising:
depositing a first protective material on a first side of a semiconductor wafer having a plurality of dies, wherein the first protective material flows into first trenches in lanes between the dies on the first side of the wafer;
depositing a second protective material on a second side of the wafer before separating the wafer along the lanes, the second protective material being different than the first material, wherein the second protective material flows into second trenches in the second side of the wafer that are aligned with the first trenches in the lanes; and
separating the wafer along the lanes after depositing a second protective material on the second side of the wafer.

11. The method of claim 10, further comprising cutting the first trenches into the first side of the wafer before depositing the protective material on the first side of the wafer.

12. The method of claim 10, further comprising:
thinning the wafer to form the second side before depositing the protective material on the second side; and
cutting trenches in the second side after thinning and before depositing the protective material onto the second side of the wafer.

13. The method of claim 10 wherein thinning the wafer comprises grinding the wafer to a thickness of approximately 300-500 microns.

14. The method of claim 10 wherein separating the wafer along the lanes comprises cutting the wafer through the first and second trenches.

15. The method of claim 14 wherein cutting the wafer forms packaged semiconductor components having a first exterior cover with a front side portion over the first side and a first extension projecting from the front side portion, a second exterior cover with a backside portion over the second side and a second extension projecting from the backside portion, and wherein the front side portion, the first extension, the backside portion, and the second extension have at least approximately the same thickness.

16. A method of manufacturing semiconductor components, comprising:
mounting conductive balls to die contacts connected to integrated circuits of dies on a semiconductor wafer, wherein the die contacts are at a first side of the wafer;
cutting first trenches into the first side of the wafer along lanes adjacent to the dies, wherein the first trenches have a first depth into the wafer;
molding a polymeric material onto the first side and into the first trenches;
thinning the wafer to a second side opposite the first side;
cutting second trenches into the second side of the wafer after the thinning procedure, wherein the second trenches are aligned with the first trenches along the lanes, and wherein the second trenches have a second depth into the wafer, such that the second trenches do not extend into the first trenches;
molding the polymeric material onto the second side and into the second trenches; and
cutting the wafer along the lanes and through the polymeric material in the second trenches, wherein cutting the wafer forms individual components that have a first exterior cover at the first side with a first extension extending toward the second side, a second exterior cover at the second side with a second extension extending toward the first side, and a sidewall between the first and second sides, wherein the sidewall includes an exterior portion of the first extension, an exterior portion of the second extension, and an exposed portion of the semiconductor wafer between the first and second extensions.

17. The method of claim 16 wherein thinning the wafer comprises grinding the backside of the wafer until the wafer has a thickness not less than 300 microns.

18. The method of claim 16 wherein cutting the wafer along the lanes comprises centering a kerf of the cut in the first and second trenches.

19. The method of claim 16 wherein the first and second exterior covers have at least approximately equal thicknesses.

20. The method of claim 1 wherein filling a portion of the first trenches comprises filling a portion of the first trenches with a first protective material, and wherein filling a portion of the second trenches comprises filling a portion of the second trenches with a second protective material, the first protective material being different than the second protective material.

21. The method of claim 20 wherein the first and second protective materials have a similar coefficient of thermal expansion.

22. The method of claim 20 wherein at least one of the first and second protective materials contains a filler configured to alter at least one of the coefficient of thermal expansion or the viscosity of the protective material.

23. The method of claim 10 wherein the first and second protective material have a similar coefficient of thermal expansion.

24. The method of claim 10 wherein at least one of the first and second protective material contains a filler that is configured to alter at least one of the coefficient of thermal expansion or the viscosity of the protective material.

* * * * *